United States Patent
Suh

(10) Patent No.: US 6,859,407 B1
(45) Date of Patent: Feb. 22, 2005

(54) MEMORY WITH AUTO REFRESH TO DESIGNATED BANKS

(75) Inventor: Jungwon Suh, Apex, NC (US)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 10/757,275

(22) Filed: Jan. 14, 2004

(51) Int. Cl.[7] .............................. G11C 7/00; G11C 8/00
(52) U.S. Cl. ................. 365/222; 365/230.03; 365/233; 365/236
(58) Field of Search ........................... 365/222, 230.03, 365/233, 236

(56) References Cited

U.S. PATENT DOCUMENTS

| | | | |
|---|---|---|---|
| 5,627,791 A | 5/1997 | Wright et al. ................ | 365/222 |
| RE36,180 E | 4/1999 | Lim ........................ | 365/189.04 |
| 5,959,929 A * | 9/1999 | Cowles et al. .......... | 365/230.03 |
| 6,192,002 B1 * | 2/2001 | Merritt ........................ | 365/236 |
| 6,373,769 B1 | 4/2002 | Kiehl et al. ................. | 365/222 |
| 6,529,433 B2 * | 3/2003 | Choi .......................... | 365/222 |
| 6,587,918 B1 | 7/2003 | Christenson ................ | 711/106 |
| 6,636,450 B2 * | 10/2003 | Blodgett ..................... | 365/222 |
| 6,680,869 B2 * | 1/2004 | Sonoda et al. .............. | 365/233 |

* cited by examiner

Primary Examiner—Trong Phan
(74) Attorney, Agent, or Firm—Dicke, Billig, and Czaja, PLLC

(57) ABSTRACT

A memory comprising $2^n$ dynamic random access memory (DRAM) banks, wherein n is an integer greater than or equal to 2, $2^n$ refresh row address counter circuits configured to generate $2^n$ sets of refresh row address signals in response to $2^n$ refresh enable signals, a multiplexer circuit configured to provide the $2^n$ sets of refresh row address signals to the $2^n$ DRAM banks in response to the $2^n$ refresh enable signals, and a bank select circuit configured to provide $2^n$ bank enable signals to the $2^n$ DRAM banks in response to at least (n+1) external address signals and in response to the $2^n$ refresh enable signals is provided. The $2^n$ bank enable signals cause at least two but less than all of the $2^n$ DRAM banks to be refreshed using at least two of the $2^n$ sets of refresh row address signals in response to the $2^n$ refresh enable signals.

24 Claims, 5 Drawing Sheets

MEMORY WITH AUTO REFRESH TO DESIGNATED BANKS

BACKGROUND

Computer systems and other electronic devices typically include a main memory that is used to provide relatively fast access to information such as instructions and data. One form of such a memory is a dynamic random access memory (DRAM). DRAM includes memory cells that are arranged in an array of rows and columns. Each memory cell can store a single bit of information. DRAM is a volatile memory which means that the memory cells only store the information as long as power is provided and as long as the memory cells are refreshed on a periodic basis. If the power is turned off or the memory cells are not refreshed, information stored in a DRAM is lost.

During normal operation, an auto refresh operation is performed periodically to refresh the memory cells in a DRAM. An auto refresh operation is performed in response to an auto refresh command that is issued by a memory controller connected to the DRAM. Unfortunately, information in the DRAM cannot be accessed by the memory controller during an auto refresh operation. As a result, the memory controller cannot perform memory operations, such as reads and writes, to the DRAM until an auto refresh operation completes. The delay in performing these memory operations may cause the performance of the computer system or other electronic device to suffer.

As the size and density of memory cells in a DRAM increase, the time it takes to perform an auto refresh operation typically increases as well. The time increase occurs because of the increase in the number of memory cells that need to be refreshed. The time increase also occurs because of internal electrical limitations such the sensing noise that increases as the number of rows of memory cells being refreshed at any given time increases.

It would be desirable to reduce the amount of time that a memory controller cannot access information in a DRAM. Accordingly, it would be desirable to improve the auto refresh operation in DRAMs.

SUMMARY

According to one exemplary embodiment, a memory comprising $2^n$ dynamic random access memory (DRAM) banks, wherein n is an integer greater than or equal to 2, $2^n$ refresh row address counter circuits configured to generate $2^n$ sets of refresh row address signals in response to $2^n$ refresh enable signals, a multiplexer circuit configured to provide the $2^n$ sets of refresh row address signals to the $2^n$ DRAM banks in response to the $2^n$ refresh enable signals, and a bank select circuit configured to provide $2^n$ bank enable signals to the $2^n$ DRAM banks in response to at least (n+1) external address signals and in response to the $2^n$ refresh enable signals is provided. The $2^n$ bank enable signals cause at least two but less than all of the $2^n$ DRAM banks to be refreshed using at least two of the $2^n$ sets of refresh row address signals in response to the $2^n$ refresh enable signals.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to one embodiment, a dynamic random access memory (DRAM) with $2^n$ banks (where n>=2) and a refresh row address counter circuits for each bank is provided. An auto refresh operation may be performed to one or more designated banks using the refresh row address counter circuits by providing a bank selector value to the DRAM using the bank addresses and one or more row addresses along with the auto refresh command. Internal bank selector signals are generated by the DRAM using the bank selector value to cause the designated banks to be refreshed. By using the bank selector signals, operations may be performed to undesignated banks of the DRAM during the auto refresh operation.

Figure 1:
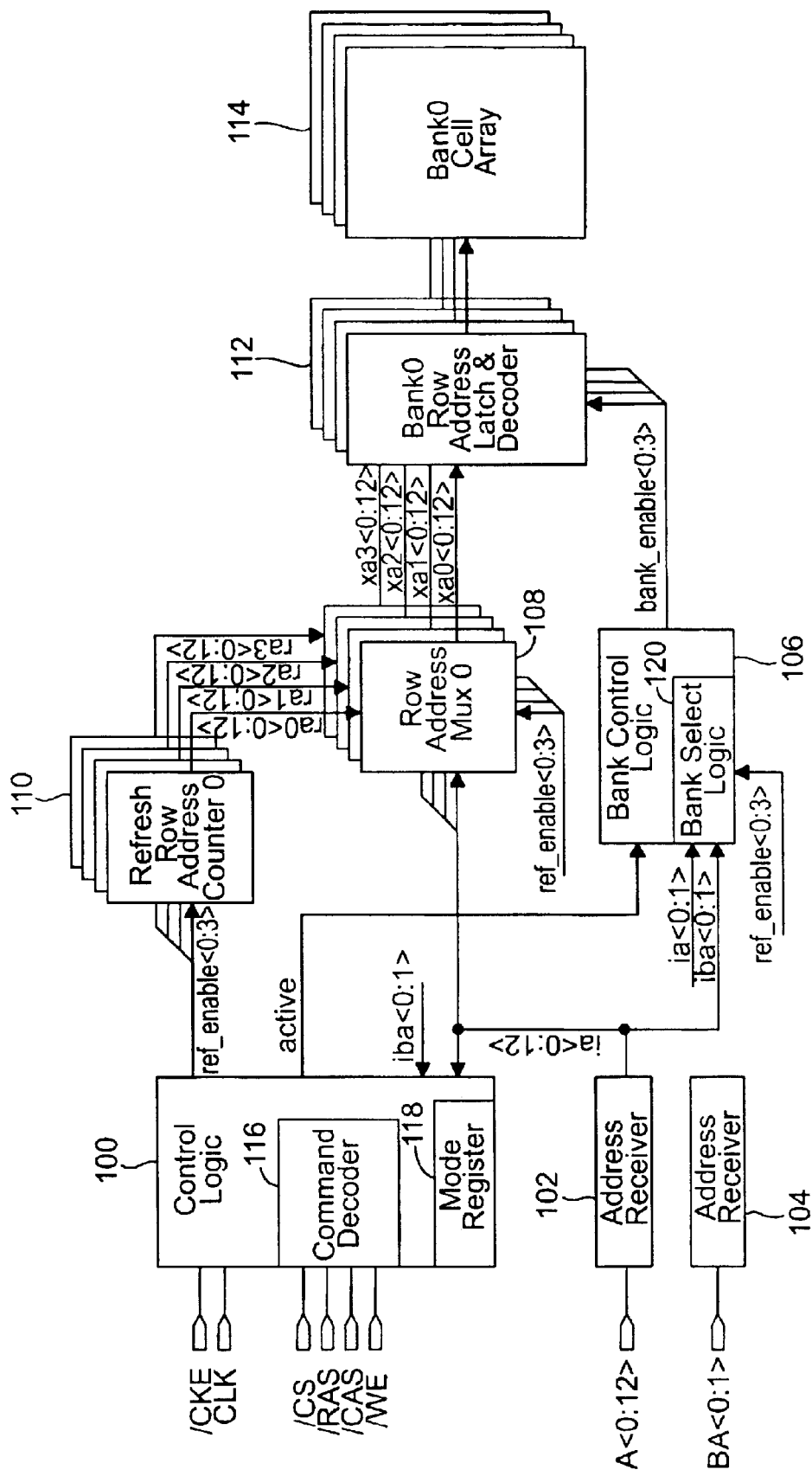
FIG. 1 is a block diagram illustrating an embodiment of a DRAM.

FIG. 1 is a block diagram illustrating an embodiment of a DRAM 10, such as a synchronous DRAM (SDRAM) or other type of DRAM, that includes $2^n$ or four banks. DRAM 10 comprises a control logic circuit 100, address receiver circuits 102 and 104, a bank control logic circuit 106, four row address multiplexer circuits 108, four refresh row address counter circuits 110, four bank row address latch and decoder circuits 112, and four bank cell arrays 114. Control logic circuit 100 comprises a command decoder circuit 116 and a mode register 118. Bank control logic circuit 106 comprises a bank select logic circuit 120. Address multiplexer circuits 108 comprise address multiplexer circuits 0 through 3, refresh row address counter circuits 110 comprise refresh row address counter circuits 0 through 3, bank row address latch and decoder circuits 112 comprise bank 0 through 3 row address latch and decoder circuits, and bank cell arrays 114 comprise bank 0 through 3 cell arrays.

Control logic circuit 100 receives a clock signal (CLK) and a clock enable signal (/CKE) on inputs from a memory controller (not shown in FIG. 1). Command decoder circuit 116 receives command signals (/CS, /RAS, /CAS, and /WE) on inputs from the memory controller. Control logic circuit 100 generates an active signal and provides the active signal to bank control logic circuit 106 as indicated by the label "active". Control logic circuit 100 also generates four refresh enable signals and provides the refresh enable signals to bank select logic circuit 120, refresh row address counter circuits 110, and row address multiplexer circuits 108 as indicated by the label "ref_enable<0:3>". More particularly, control logic circuit 100 provides ref_enable<0>to refresh row address counter circuit 0 and row address multiplexer circuit 0, and ref_enable<1>to refresh row address counter circuit 1 and row address multiplexer circuit 1, etc.

Address receiver circuits 102 and 104 receive external address signals on address inputs from the memory controller. More particularly, address receiver circuit 102 receives a set of row address signals A<0:12>, i.e., a row address, and address receiver circuit 104 receives a set of bank address signals BA<0:1>, i.e., a bank address. Address receiver 102 provides each of the row address signals to control logic circuit 100 and row address multiplexer circuits 108 as indicated by the label "ia<0:12>". Address receiver 102 also provides two of the row address signals to bank select logic circuit 120 as indicated by the label "ia<0.1>". Address receiver 104 provides the bank address to bank select logic circuit 106 and control logic circuit 100 as indicated by the label "iba<0:1>".

Bank control logic circuit 106 receives the active signal from control logic circuit 100, and bank select logic circuit 120 receives the two row address signals from address receiver circuit 102, the bank address signal from address receiver circuit 104, and the four refresh enable signals from control logic circuit 100. Bank control logic circuit 106 generates four bank enable signals in response to the active, refresh enable, row address, and bank address signals and provides the bank enable signals to bank row address latch and decoder circuits 112 as indicated by the label "bank_enable<0:3>". The generation of the bank enable signals will be described in additional detail below.

Refresh row address counter circuits 110 each receive a refresh enable signal from control logic circuit 100. Refresh row address counter circuits 110 each generates a set of refresh row address signals, i.e., a refresh row address, and each provides the refresh row address to row address multiplexer circuits 108 as indicated by the labels ra0<0:12>, ra1<0:12>, ra2<0:12>, and ra3<0:12> in response to receiving a refresh enable signal.

Row address multiplexer circuits 108 each receive a row address from address receiver circuit 102, a refresh row address from refresh row address counters 110, and a refresh enable signal from control logic circuit 100. Row address multiplexer circuits 108 each select either the row address or the refresh row address according to a value of the refresh enable signal and provides the selected address to bank row address latch and decoder circuits 112 as indicated by the labels xa0<0.12>, xa1<0:12>, xa2<0:12>, and xa3<0:12>. Although shown as separate circuits in FIG. 1, multiplexer circuits 108 may comprise a single multiplexer circuit in other embodiments.

Bank row address latch and decoder circuits 112 receive the selected addresses from row address multiplexer circuits 108 and the bank enable signals from bank control logic circuit 106. Bank row address latch and decoder circuits 112 latch the selected addresses according to the bank enable signals and provide the selected addresses to bank cell arrays 114.

Bank cell arrays 114 each comprise an array of DRAM cells arranged in rows and columns. The DRAMS cells in a row are addressable using a row address, and the DRAMS cells in a column are addressable using a column address. Each DRAM cells stores one bit of information.

As used herein, the term "DRAM bank" refers to a bank row address latch and decoder circuit 112 and an associated bank cell array 114. For example, DRAM bank 0 refers to bank 0 row address latch and decoder circuit and bank 0 cell array, DRAM bank 1 refers to bank 1 row address latch and decoder circuit and bank 1 cell array, etc.

Each refresh row address counter circuit 110 and each row address multiplexer circuit 108 are associated with a particular DRAM bank. For example, refresh row address counter circuit 0 provides a refresh row address to row address multiplexer circuit 0 which, in turn, provides either that refresh row address or the external row address to DRAM bank 0. Similarly, refresh row address counter circuit 1 provides a refresh row address to row address multiplexer circuit 1 which, in turn provides either that refresh row address or the external row address to DRAM bank 1, etc. In addition, DRAM bank 0 receives bank enable signal 0 from bank control logic circuit 106, and DRAM bank 1 receives bank enable signal 1 from bank control logic circuit 106, etc.

DRAM 10 is configured to store information into the DRAM banks and read information from the DRAM banks in response to write and read operations, respectively.

During normal operation, an auto refresh operation is performed periodically to refresh the memory cells in DRAM 10. An auto refresh operation is performed in response to an auto refresh command that is issued by the memory controller connected to the DRAM. In the embodiment of FIG. 1, an auto refresh operation is performed to one or more designated DRAM banks using the refresh row address counter circuits in response to receiving an auto refresh command and a bank selector value from the memory controller. The bank selector value is provided to DRAM 10 on the bank address inputs and two row address inputs in the embodiment of FIG. 1.

In response to receiving the auto refresh command, the bank address inputs and two row address inputs, control logic circuit 100 generates the four refresh enable signals and provides the refresh enable signals to row address multiplexers 108, refresh row address counter circuits 110, and bank select logic circuit 120. Control logic circuit 100 also generates the active signal and provides the active signal to bank select logic circuit 120.

Refresh row address counter circuits 110 generate refresh row addresses for each DRAM bank that is to be refreshed in response to the refresh enable signals and provide the refresh row addresses to row address multiplexers 108. Refresh row address counter circuits 10 may generate the same or different refresh row addresses for each DRAM bank at various times during the auto refresh operation.

In response to receiving refresh enable signals, row address multiplexers 108 provide the refresh row addresses from refresh row address counter circuits 110 to the DRAM banks for each DRAM bank that is to be refreshed.

Bank select logic circuit 120 receives the bank selector value from the external bank address and two external row address signals, BA<0:1> and A<0:1>, respectively. In response to receiving the refresh enable signals, the active signal, and the bank selector value, bank select logic circuit 120 generates the bank enable signals to designate the DRAM banks to be refreshed. In one embodiment, bank select logic circuit 120 generates the bank enable signals according to a truth table 200 shown in FIG. 2. In other embodiments, other values of the bank and row addresses may be used to designate one or more banks to be refreshed.

Figures 2, 3:
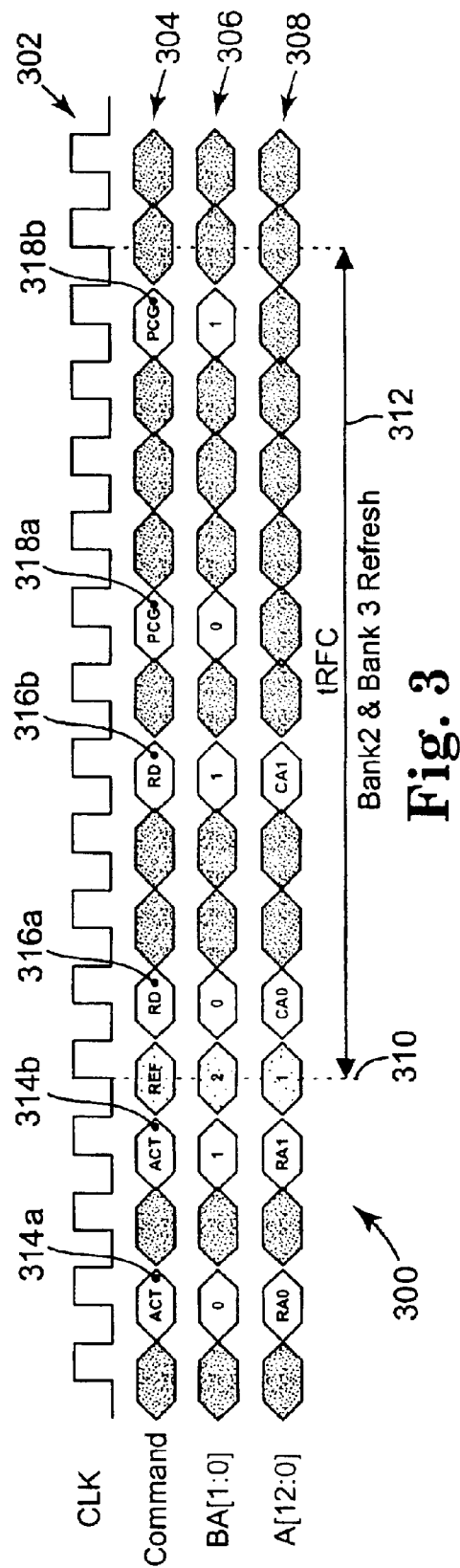
FIG. 2 is a table illustrating an embodiment of signal values for designating DRAM banks in the embodiment of FIG. 1.
FIG. 3 is a timing diagram illustrating an auto refresh operation to designated banks in the embodiment of FIG. 1.

Truth table 200 illustrates which DRAM banks (indicated by labels BK0, BK1, BK2, and BK3) are designated according to the values of the bank address signals BA<0> and BA<1> and the row address signals A<0> and A<1>. The value "X" in FIG. 2 represents a "don't care" value meaning that the signal may be either "0" or "1". For example, to designate only DRAM bank 1 for refresh, a bank selector value with BA<0>=1, BA<1>=0, A<0>=0, and A<1>=0 is provided to bank select logic circuit 120. In response to this bank selector value, bank control logic circuit 106 only generates a bank enable signal for DRAM bank 1 and provides the bank enable signal to DRAM bank 1 to cause only DRAM bank 1 to be refreshed. Similarly, control logic circuit 100 only generates a refresh enable signal for DRAM bank 1 and provides the refreshed enable signal to refresh row address counter circuit 1 and row address multiplexer circuit 1 to cause only DRAM bank 1 to be refreshed.

As another example, a bank selector value with BA<1>=1, A<0>=1, and A<1>=0 is provided to bank select logic circuit 120 where the value of BA<0> is "don't care" to designate DRAM banks 2 and 3 for refresh. In response to this bank selector value, bank control logic circuit 106 only generates bank enable signals for DRAM banks 2 and 3 and provides the bank enable signals to DRAM banks 2 and 3 to cause only DRAM banks 2 and 3 to be refreshed. Similarly, control logic circuit 100 only generates refresh enable signals for DRAM banks 2 and 3 and provides the refreshed enable signals to refresh row address counter circuits 2 and 3 and row address multiplexer circuits 2 and 3 to cause only DRAM banks 2 and 3 to be refreshed.

In a further example, a bank selector value with A<0>=1 and A<1>=1 is provided to bank select logic circuit 120 to designate all of the DRAM banks for refresh. In response to this bank selector value, bank control logic circuit 106 generates bank enable signals for DRAM banks 0 through 3 and provides the bank enable signals to DRAM banks 0 through 3 to cause all of the DRAM banks to be refreshed. Similarly, control logic circuit 100 generates refresh enable signals for DRAM banks 0 through 3 and provides the refreshed enable signals to refresh row address counter circuits 0 through 3 and row address multiplexer circuits 0 through 3 to cause all of the DRAM banks to be refreshed.

By using the bank selector signals to designate DRAM banks to be refreshed, operations may be performed to undesignated DRAM banks while the designate DRAM banks are undergoing the auto refresh operation. FIG. 3 is a timing diagram 300 illustrating the timing an auto refresh operation to designated banks relative to operations performed to other banks in the embodiment of FIG. 1.

FIG. 3 shows a clock signal 302, a command signal 304, bank address signals 306, and row address signals 308. As indicated at a time 310, an auto refresh command (REF) is provided to DRAM 10 along with a bank selector value that comprises a decimal value of 2 on the bank address signals and a decimal value of 1 on the row address signals, i.e., BA<0>=0, BA<1>=1, A<0>=1, and A<1>=0, to initiate an auto refresh operation on DRAM banks 2 and 3. The auto refresh operation occurs during the time period tRFC indicated by the arrow 312.

As shown in FIG. 3, bank active commands (ACT) 314a and 314b may be provided to DRAM 10 along with bank addresses that designate banks 0 and 1, respectively, and row addresses (RA0 and RA1) to perform bank active operations on banks 0 and 1, respectively, prior to the auto refresh operation of banks 2 and 3 being initiated. In addition, read (RD) and precharge (PCG) operations may be performed on DRAM banks 0 and 1 during the auto refresh operation of DRAM banks 2 and 3 as indicated by the read commands 316a and 316b and the precharge commands 318a and 318b that designate DRAM banks 0 and 1, respectively. In response to write commands, write operations may also be performed on DRAM banks 0 and 1 during the auto refresh operation of DRAM banks 2 and 3 (not shown).

Figure 4:
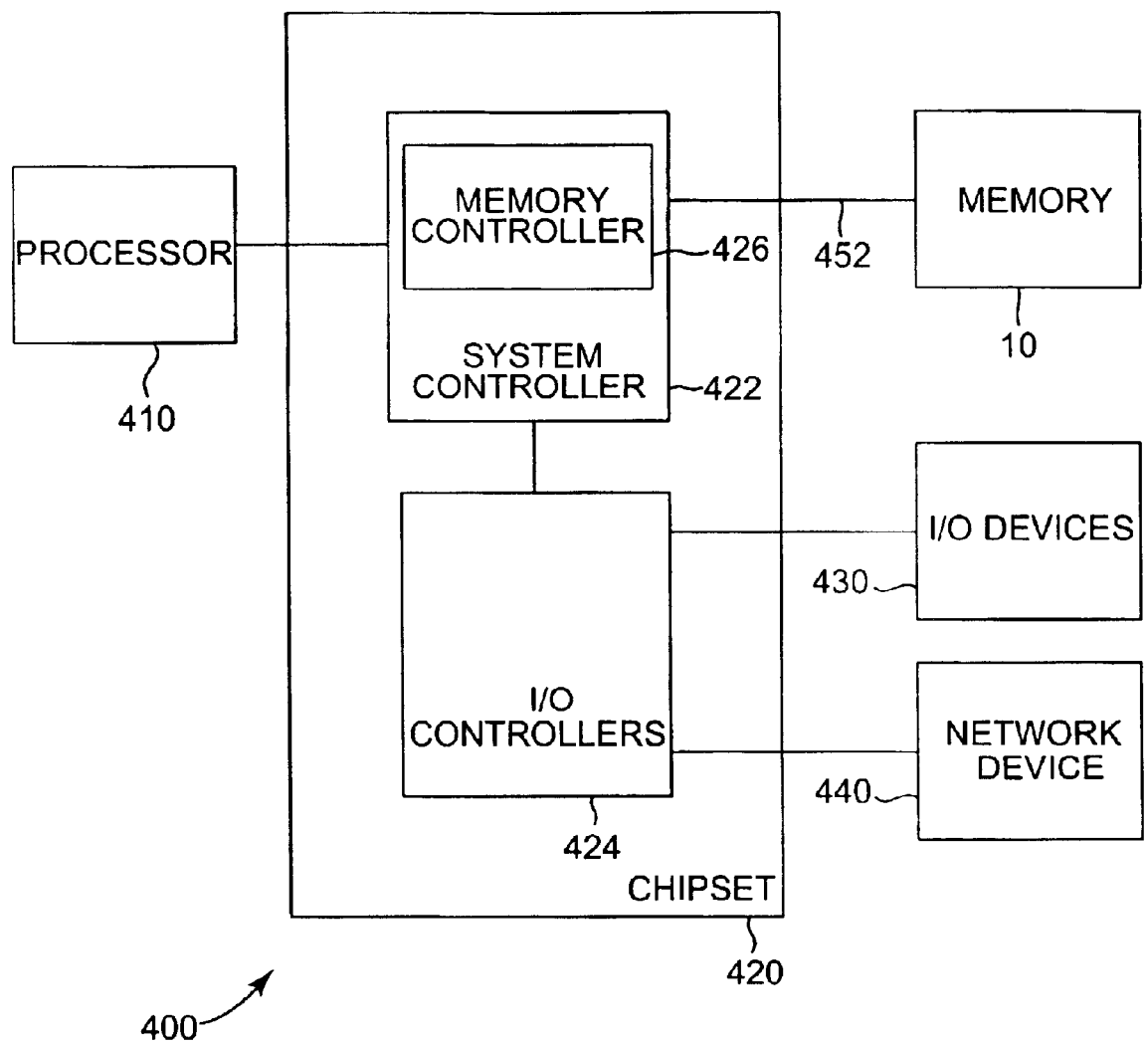
FIG. 4 is a block diagram illustrating an embodiment of a computer system that includes the embodiment of FIG. 1.

FIG. 4 is a block diagram illustrating an embodiment of a computer system 400 that includes DRAM 10. In FIG. 4, computer system 400 includes a processor 410, a chipset 420, DRAM 10, input/output (I/O) devices 430, and a network device 440. Chipset 420 comprises a system controller 422 coupled to processor 410 and I/O controllers 424 coupled to I/O devices 430 and network device 440. System controller 422 includes a memory controller 426 coupled to DRAM 10.

Computer system 400 may be any type of computer system configured to execute instructions such as a personal computer, a laptop, a server, a personal digital assistant (PDA), an audio or video device, or a mobile telephone.

Computer system 400 may include any number of processors in addition to processor 410.

Memory controller 426 is configured to store information into and read information from DRAM 10 in response to write and read transactions, respectively, from processors 410, I/O devices 430, and network device 440. Memory controller 426 may include hardware and/or software configured to perform memory scrubbing or other error correction functions on DRAM 10 in response to reading information from DRAM 10. In response to commands from system firmware (not shown) or an operating system, memory controller 426 may cause information to be loaded from an I/O device, such as a hard drive or a CD-ROM drive, or network device 440 into DRAM 10. I/O controllers 424 may include any type and number of controllers and bus bridges configured to manage one or more I/O devices 430 and network device 440. I/O devices 430 may include any type and number of devices configured to communicate with computer system 400 using I/O controllers 424.

Network device 440 is configured to allow computer system 400 to communicate with other computer systems and storage devices (not shown) by transferring information between computer system 400 and other computer systems and storage devices.

Memory controller 426 is configured to initiate auto refresh operations to designated DRAM banks of DRAM 10 by providing an auto refresh command along with a bank selector value to DRAM 10 as will now be described with reference to FIG. 5. Memory controller 426 includes scheduling logic configured to count the number of refresh operations for each DRAM bank to ensure that each DRAM bank is refreshed at appropriate intervals.

Figure 5:
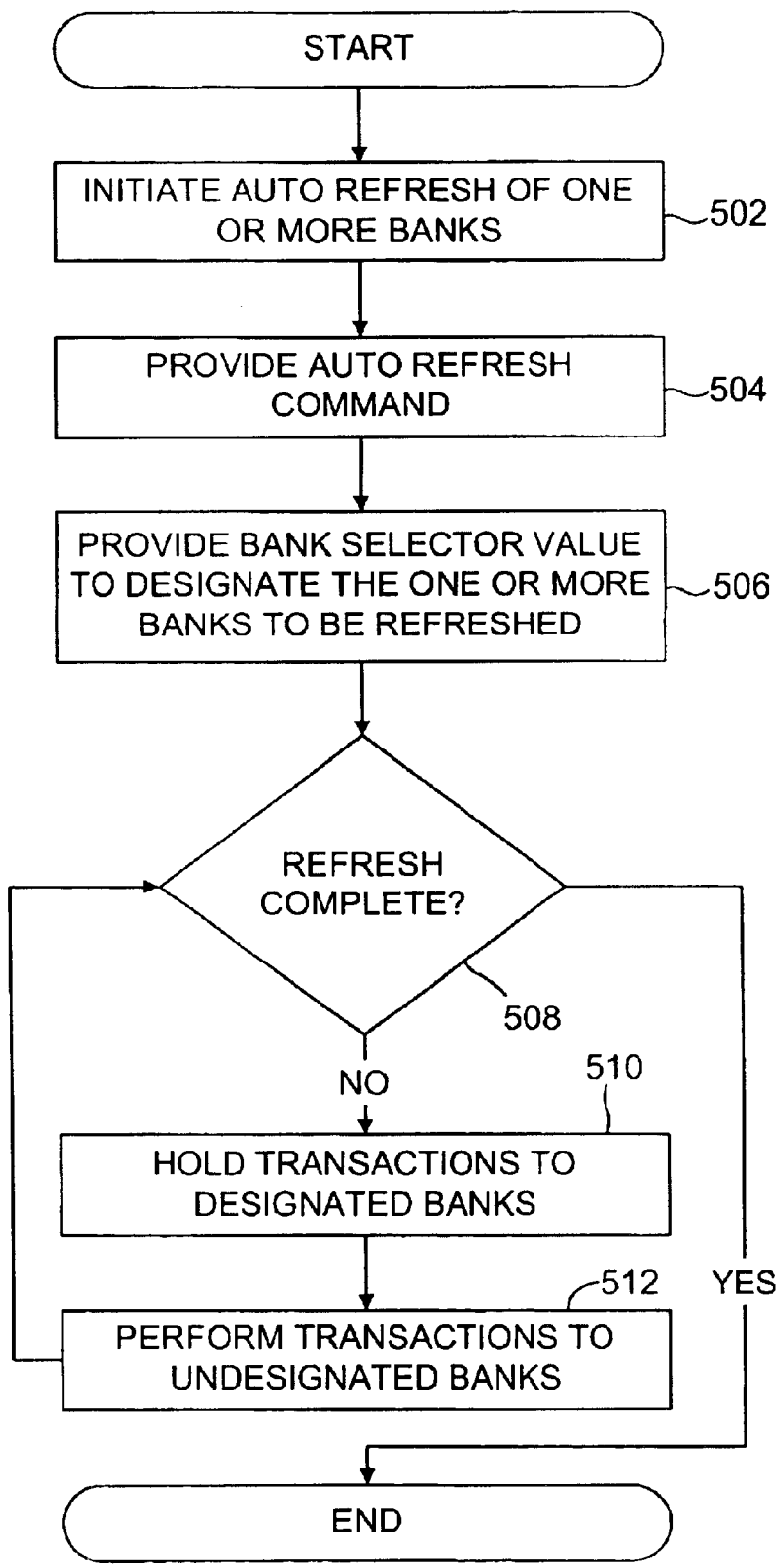
FIG. 5 is a flow chart illustrating an embodiment of a method for initiating an auto refresh operation of designated banks.

FIG. 5 is a flow chart illustrating an embodiment of a method for initiating an auto refresh operation of designated banks. In FIG. 5, an auto refresh operation of one or more DRAM banks is initiated by memory controller 426 as indicated in a block 502. Memory controller 426 provides an auto refresh command to DRAM 10 as indicated in a block 504. Memory controller 426 provides a bank selector value to designate the one or more DRAM banks to be refreshed as indicated in a block 506.

A determination is made by memory controller 426 as to whether the auto refresh operation is complete as indicated in a block 508. If the auto refresh operation is not complete, then memory controller 426 holds transactions to the designated banks until then auto refresh operation completes as indicated by a block 510. Memory controller 426 may perform transactions such as read and write operations and bank active and precharge operations to undesignated banks prior to the auto refresh operation completing as indicated by a block 512.

Figure 6:
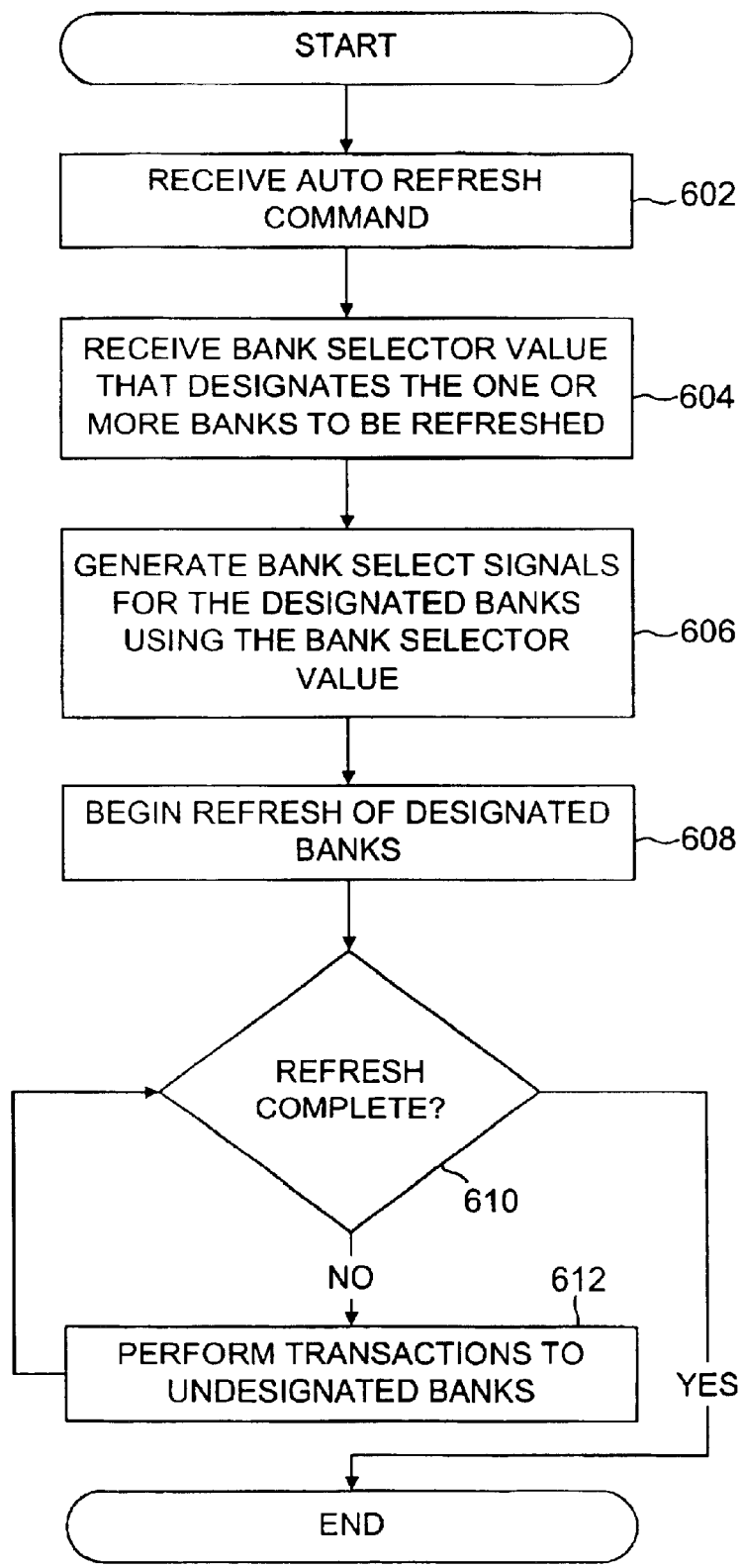
FIG. 6 is a flow chart illustrating an embodiment of a method for performing an auto refresh operation of designated banks.

FIG. 6 is a flow chart illustrating an embodiment of a method for performing an auto refresh operation of designated banks by DRAM 10 in conjunction with memory controller 426. In FIG. 6, DRAM 10 receives an auto refresh command from memory controller 426 as indicated in a block 602. DRAM 10 receives a bank selector value that designates one or more DRAM banks to be refreshed from memory controller 426 as indicated in a block 604. DRAM 10 generates a bank selector signal for each of the designated DRAM banks using the bank selector value as indicated in a block 606.

DRAM 10 begins the refresh of the designated banks as indicated in a block 608. A determination is made by DRAM 10 as to whether the auto refresh operation is complete as indicated in a block 610. If the auto refresh operation is not complete, then DRAM 10 may perform transactions such as read and write operations and bank active and precharge operations to undesignated banks prior to the auto refresh operation completing as indicated by a block 612.

Although the embodiment shown in FIG. 1 included $2^2$ or four DRAM banks and used four address signals to provide the bank selector value, other embodiment will include other numbers of DRAM banks and use other numbers of address signals to provide the bank selector value. In general, the other embodiments may include $2^n$ DRAM banks where n is greater than or equal to 2. In these embodiments, at least (n+1) address signals, e.g, n bank address signals and at least 1 row address signal, will be used to provide the bank selector value to the DRAM to allow one or more DRAM banks to be designated for refresh in performing an auto refresh operation.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A memory comprising:
   $2^n$ dynamic random access memory (DRAM) banks, wherein n is an integer greater than or equal to 2;
   $2^n$ refresh row address counter circuits each configured to generate a set of refresh row address signals in response to $2^n$ refresh enable signals;
   a multiplexer circuit configured to provide the sets of refresh row address signals to the $2^n$ DRAM banks in response to the $2^n$ refresh enable signals; and
   a bank select circuit configured to provide $2^n$ bank enable signals to the $2^n$ DRAM banks in response to at least (n+1) external address signals and in response to the $2^n$ refresh enable signals;
   wherein the $2^n$ bank enable signals cause at least two but less than all of the $2^n$ DRAM banks to be refreshed using at least two of the sets of refresh row address signals in response to the $2^n$ refresh enable signals.

2. The memory of claim 1 further comprising:
   a control circuit configured to generate the $2^n$ refresh enable signals and configured to provide the $2^n$ refresh enable signals to the $2^n$ refresh row address counter circuits, the multiplexer circuit, and the bank select circuit.

3. The memory of claim 2 wherein the control circuit is configured to generate the $2^n$ refresh enable signals to cause an auto refresh operation to be performed.

4. The memory of claim 1 wherein the at least (n+1) external address signals comprise n external bank address signals and at least one external row address signal.

5. The memory of claim 4 wherein the multiplexer circuit is configured to receive a plurality of external row address signals that include the at least one external row address signal.

6. The memory of claim 1 wherein the multiplexer circuit comprises $2^n$ multiplexers, wherein each of the $2^n$ multiplexers is configured to receive a plurality of external row address signals and one of the $2^n$ sets of refresh row address signals, and wherein each of the $2^n$ multiplexers is configured to provide one of the $2^n$ sets of refresh row address signals to one of the $2^n$ DRAM banks in response to the $2^n$ refresh enable signals.

7. The memory of claim 1 wherein each of the $2^n$ DRAM banks comprises a bank row address latch and decoder and a bank cell array.

8. The memory of claim 1 wherein the at least two of the $2^n$ sets of refresh row address signals provide different values to the at least two but less than all of the $2^n$ DRAM banks at a given time in response to the $2^n$ refresh enable signals.

9. A system comprising:
   a dynamic random access memory (DRAM) comprising:
   n bank address inputs;
   m row address inputs;
   $2^n$ banks; and
   $2^n$ refresh row address counters;
   wherein n is a first integer greater than or equal to 2, and wherein m is a second integer greater than or equal to 2; and
   a memory controller configured to generate a bank selector value associated with an auto refresh operation and configured to initiate the auto refresh operation to cause at least two of the banks to be refreshed using at least two of the refresh row address counters by providing the bank selector value to the DRAM using the n bank address inputs and at least one of the m row address inputs.

10. The system of claim 9 wherein the memory controller is configured to perform a read or write operation to one or more of the banks other than the at least two banks being refreshed during the auto refresh operation.

11. The system of claim 9 wherein the memory controller is configured to perform a bank active or a precharge operation to one or more of the banks other than the at least two banks being refreshed during the auto refresh operation.

12. The system of claim 9 wherein the memory controller is configured to provide an auto refresh command associated with the auto refresh operation to the DRAM along with the bank selector value.

13. The system of claim 12 wherein the memory controller is configured to provide a read or a write command to the DRAM subsequent to providing the auto refresh command to the DRAM and prior to completing the auto refresh operation.

14. The system of claim 12 wherein the memory controller is configured to provide a bank active or a precharge command to the DRAM subsequent to providing the auto refresh command to the DRAM and prior to completing the auto refresh operation.

15. The system of claim 9 wherein the DRAM comprises synchronous DRAM (SDRAM).

16. The system of claim 9 wherein each of the at least two refresh row address counters provide different refresh row address values to the at least two banks at a given time.

17. A method of performing an auto refresh operation in a dynamic random access memory (DRAM) that includes $2^n$ banks where n is an integer greater than or equal to 2, the method comprising:

receiving an auto refresh command;

receiving a bank selector value that designates at least two but less than all of the banks; and refreshing the banks designated by the bank selector value.

18. The method of claim 17 further comprising:

performing a operation to a bank not designated by the bank selector value while refreshing the banks designated by the bank selector value.

19. The method of claim 17 further comprising:

receiving the bank selector value using n bank address inputs and at least one row address input.

20. The method of claim 17 further comprising:

generating a bank select signal for each of the designated banks using the bank selector value.

21. The method of claim 17 further comprising:

refreshing the banks designated by the bank selector value using one of a plurality of sets of refresh row addresses for each of the designated banks.

22. A memory comprising:

$2^n$ dynamic random access memory (DRAM) banks, wherein n is an integer greater than or equal to 2;

$2^n$ refresh row address counter circuits each configured to generate a set of refresh row address signals in response to $2^n$ refresh enable signals;

a multiplexer circuit configured to provide the sets of refresh row address signals to the $2^n$ DRAM banks in response to the $2^n$ refresh enable signals;

a bank select circuit configured to provide $2^n$ bank enable signals to the $2^n$ DRAM banks in response to at least (n+1) external address signals and in response to the $2^n$ refresh enable signals; and a control circuit configured to generate the $2^n$ refresh enable signals and configured to provide the $2^n$ refresh enable signals to the $2^n$ refresh row address counter circuits, the multiplexer circuit, and the bank select circuit;

wherein the $2^n$ bank enable signals cause at least two but less than all of the $2^n$ DRAM banks to be refreshed using at least two of the sets of refresh row address signals in response to the $2^n$ refresh enable signals, and wherein the at least two of the $2^n$ sets of refresh row address signals provide different values to the at least two but less than all of the $2^n$ DRAM banks at a given time in response to the $2^n$ refresh enable signals.

23. The memory of claim 22 wherein the at least (n+1) external address signals comprise n external bank address signals and at least one external row address signal.

24. The memory of claim 23 wherein the multiplexer circuit is configured to receive a plurality of external row address signals that include the at least one external row address signal.

* * * * *